US008853796B2

(12) United States Patent
Teh et al.

(10) Patent No.: US 8,853,796 B2
(45) Date of Patent: Oct. 7, 2014

(54) HIGH-K METAL GATE DEVICE

(75) Inventors: Young Way Teh, Wappingers Falls, NY (US); Michael V. Aquilino, Wappingers Falls, NY (US); Arifuzzaman (Arif) Sheikh, Poughkeepsie, NY (US); Yun Ling Tan, Singapore (SG); Hao Zhang, Singapore (SG); Deleep R. Nair, Fishkill, NY (US); Jinghong H. (John) Li, Poughquag, NY (US)

(73) Assignees: GLOBALFOUNDIERS Singapore Pte. Ltd., Singapore (SG); International Business Machines Corporation

( * ) Notice: Subject to any disclaimer, the term of this patent is extended or adjusted under 35 U.S.C. 154(b) by 15 days.

(21) Appl. No.: 13/110,922

(22) Filed: May 19, 2011

(65) Prior Publication Data
US 2012/0292719 A1    Nov. 22, 2012

(51) Int. Cl.
H01L 29/772    (2006.01)
H01L 21/28    (2006.01)
H01L 29/423    (2006.01)
H01L 29/51    (2006.01)
H01L 29/49    (2006.01)

(52) U.S. Cl.
CPC .... *H01L 21/28114* (2013.01); *H01L 29/42376* (2013.01); *H01L 29/518* (2013.01); *H01L 29/4966* (2013.01)
USPC ...... 257/410; 438/585; 257/288; 257/E21.19; 257/E29.242

(58) Field of Classification Search
USPC .......... 257/410; 438/142, 400, 309, 478, 585, 438/287
See application file for complete search history.

(56) References Cited

U.S. PATENT DOCUMENTS

| | | | | |
|---|---|---|---|---|
| 6,127,718 | A * | 10/2000 | Okayama et al. | 257/506 |
| 8,053,322 | B2 * | 11/2011 | Drobny et al. | 438/296 |
| 8,076,735 | B2 * | 12/2011 | Lin | 257/407 |
| 8,143,131 | B2 * | 3/2012 | Hsu et al. | 438/303 |
| 2002/0132437 | A1 * | 9/2002 | Tsou et al. | 438/341 |
| 2006/0060913 | A1 * | 3/2006 | Ozawa | 257/317 |
| 2006/0166438 | A1 * | 7/2006 | Servalli et al. | 438/257 |
| 2006/0205158 | A1 * | 9/2006 | Kim | 438/263 |
| 2006/0278916 | A1 * | 12/2006 | Iino et al. | 257/315 |
| 2007/0126067 | A1 * | 6/2007 | Hattendorf et al. | 257/412 |
| 2007/0158751 | A1 * | 7/2007 | Yun | 257/368 |
| 2007/0207567 | A1 * | 9/2007 | Geiss et al. | 438/104 |
| 2007/0257289 | A1 * | 11/2007 | Yang et al. | 257/296 |
| 2007/0296053 | A1 * | 12/2007 | Hasunuma et al. | 257/506 |
| 2008/0023749 | A1 * | 1/2008 | Kim et al. | 257/316 |
| 2010/0078728 | A1 * | 4/2010 | Li et al. | 257/369 |
| 2011/0294266 | A1 * | 12/2011 | Ohnuma et al. | 438/151 |
| 2012/0168895 | A1 * | 7/2012 | Yin et al. | 257/506 |

* cited by examiner

*Primary Examiner* — Mark A Laurenzi
*Assistant Examiner* — Mounir Amer
(74) *Attorney, Agent, or Firm* — Horizon IP Pte Ltd

(57) ABSTRACT

A device includes a substrate with a device region surrounded by an isolation region, in which the device region includes edge portions along a width of the device region and a central portion. The device further includes a gate layer disposed on the substrate over the device region, in which the gate layer includes a graded thickness in which the gate layer at edge portions of the device region has a thickness $T_E$ that is different from a thickness $T_C$ at the central portion of the device region.

26 Claims, 12 Drawing Sheets

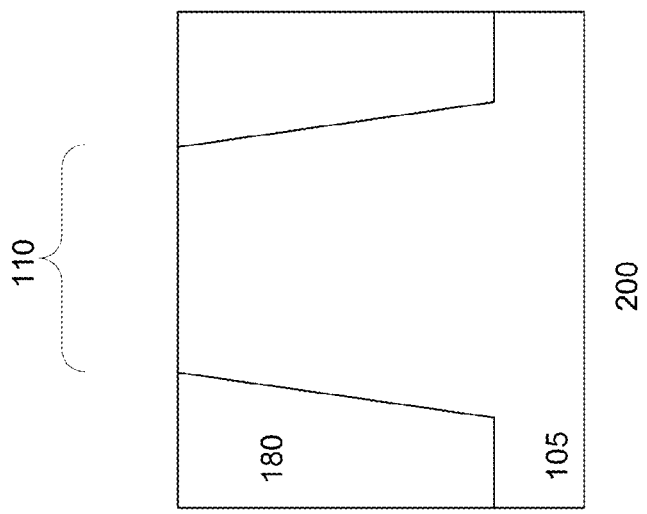

HIGH-K METAL GATE DEVICE

BACKGROUND

Figure 1A:
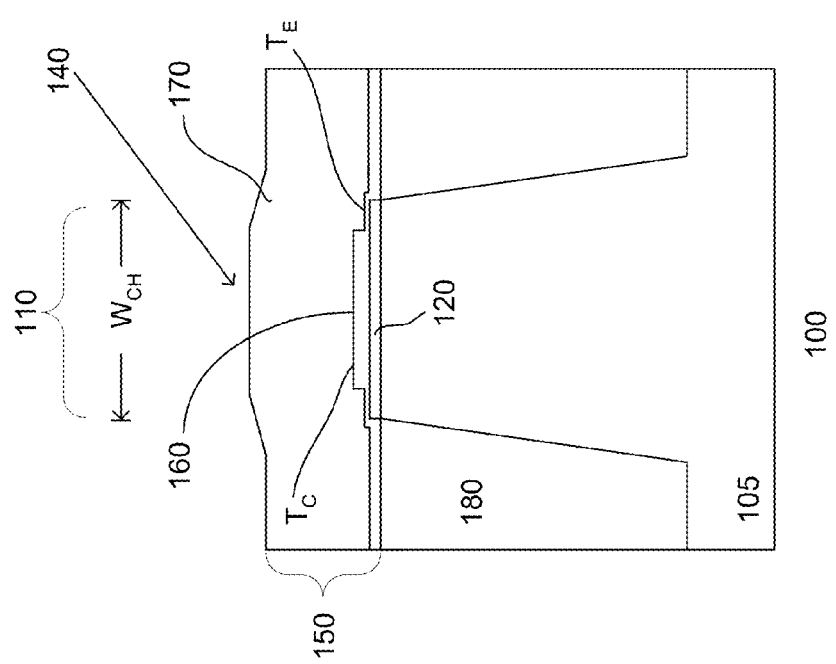

Semiconductor devices are continuously improved to enhance device performance. A fundamental building block of semiconductor devices is, for example, a transistor device which includes a gate stack on a semiconductor substrate. The gate stack includes a gate electrode over a gate dielectric layer. Smaller devices and shrinking ground rules are the keys to enhance performance and to reduce cost. As devices are being scaled down, the technology becomes more complex, and changes in device structures and materials as well as new fabrication methods are needed to maintain the expected performance enhancement from one generation of devices to the next.

High-K metal gate transistors have been investigated for future devices. A high-K metal gate transistor includes a metal gate electrode layer over a high k gate dielectric layer. However, high-K metal gate transistors exhibit high $V_T$ roll up for narrow width devices, in particular for n-type devices. High $V_T$ roll up is undesirable as this degrades the narrow device $I_{eff}$ and performance, where $I_{eff}$ refers to the on current of the device.

From the foregoing discussion, it is desirable to provide a high-k metal gate transistor with improved performance and reliability.

SUMMARY

A method for forming a semiconductor device is disclosed. The method includes providing a substrate prepared with a device region surrounded by an isolation region, in which the device region includes edge portions along a width direction of the device region and a central portion between the edge portions. The method further includes forming a gate electrode layer in the device region, in which the gate electrode layer comprises a graded thickness in which a thickness $T_E$ at edge portions of the device region is different from a thickness $T_C$ at the central portion of the device region.

In one embodiment, a device is presented. The device includes a substrate with a device region surrounded by an isolation region, in which the device region includes edge portions along a width of the device region and a central portion. The device further includes a gate layer disposed on the substrate over the device region, in which the gate layer includes a graded thickness in which the gate layer at edge portions of the device region has a thickness $T_E$ that is different from a thickness $T_C$ at the central portion of the device region.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

DRAWINGS

Figure 1B:
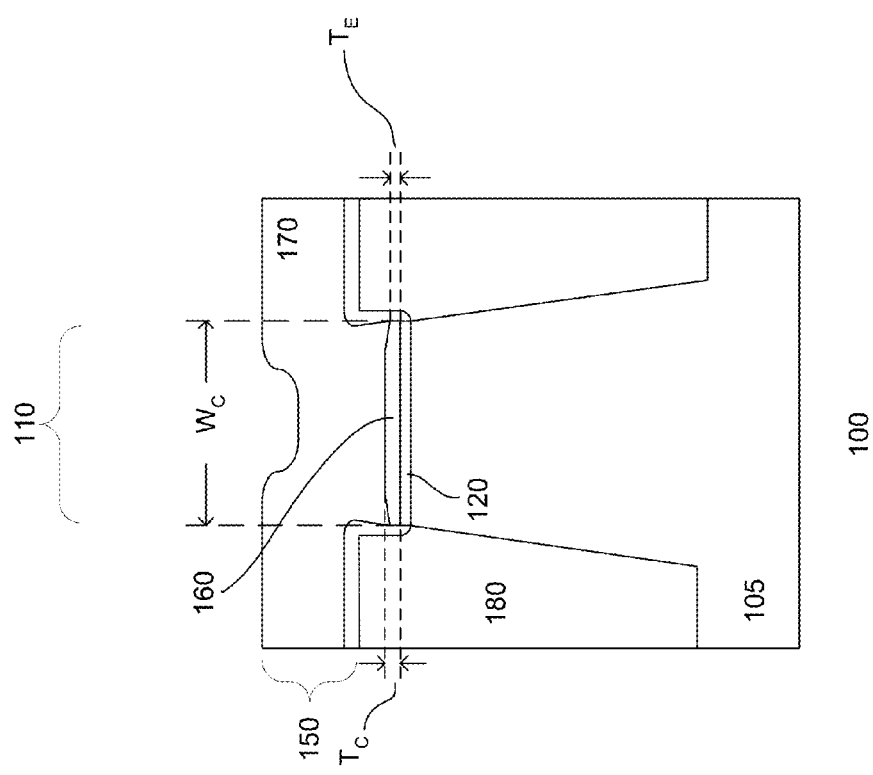

In the drawings, like reference characters generally refer to the same parts throughout the different views. Also, the drawings are not necessarily to scale, emphasis instead generally being placed upon illustrating the principles of the invention. Embodiments will now be described, by way of example with reference to the drawings of which:

FIGS. 1a-b are cross-sectional views of different embodiments of a device;

FIGS. 2a-e show a process of forming an embodiment of a device;

FIGS. 3a-d show a process of forming another embodiment of a device; and

Figure 4:
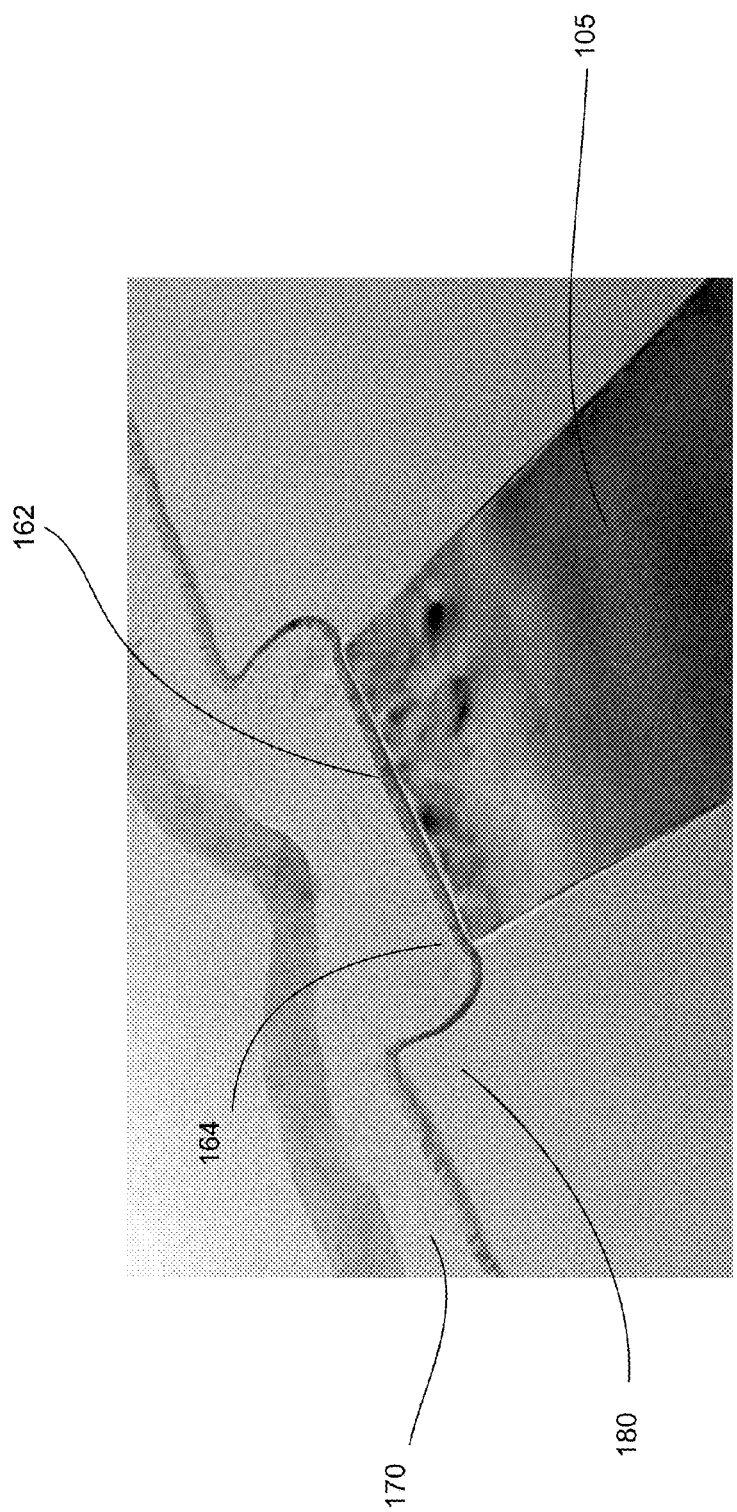

FIG. 4 shows SEM of an embodiment of a device.

DETAILED DESCRIPTION

Embodiments generally relate to semiconductor devices. Some embodiments relate to devices having high-K metal gate. Such devices, for example, can be incorporated into standalone devices or ICs, such as microcontrollers or system on chips (SoCs). Other types of devices may also be useful. The devices or ICs can be incorporated into or used with, for example, electronic products, computers, cell phones, and personal digital assistants (PDAs). The devices may also be incorporated into other types of products.

FIGS. 1a-b show cross-sectional views of embodiments of a portion of a device 100. The cross-sectional view is along the direction of a channel width $W_{CH}$ of the device. For example, the cross-sectional view is along a direction of the width of the channel width of a transistor. Referring to FIG. 1a, a substrate 105 is shown. The substrate, for example, is a semiconductor substrate, such as a silicon substrate. In one embodiment, the substrate comprises a p-type doped substrate. For example, the p-type doped substrate is a lightly doped p-type substrate. Other types of semiconductor substrates, including group III-IV substrate or those which are undoped or doped with the same or different types of dopants, such as silicon on insulator (SOI), silicon germanium, or gallium, may also be used. Providing other types of substrate may also be useful.

The substrate includes a device region 110. The device region, for example, is surrounded by an isolation region or dielectric region 180. The isolation region separates the device region from other device regions on the substrate (not shown). The isolation region, in one embodiment, is a shallow trench isolation (STI) region. Other types of isolation regions, such as LOCOS, may also be employed. The STI region, for example, extends to a depth of about 300 nm. Providing STI regions which extend to other depths may also be useful.

The device region, for example, is an active device region of a transistor. The transistor, for example, may be a metal oxide semiconductor field effect transistor (MOSFET). Other types of transistors may also be useful. A doped well (not shown) may be provided in the device region for the transistor. The doped well, for example, may extend below the isolation region. For example, the doped well extends to about 400-500 nm deep. The doped well may have a second polarity type dopant for a first polarity type transistor. For example, a p-type doped well is for a n-type transistor or a n-type well is for a p-type transistor. The dopant concentration of the doped well, for example, may be about the range of 1E12-E13 $cm^{-2}$. Other parameters for the doped well may also be useful. P-type dopants may include boron (B), aluminum (Al), indium (In) or a combination thereof, while n-type dopants may include phosphorus (P), arsenic (As), antimony (Sb) or a combination thereof.

The substrate may include other device regions. The device regions may be for other types of devices, including both p-type and n-type devices. For example, the IC may include logic regions in which logic devices are formed. Depending on the type of IC formed, the logic regions, for example, may include regions for different voltage devices. For example, the logic regions may include regions for high voltage (HV)

devices, medium or intermediate voltage (IV) devices and low voltage (LV) devices. Other configurations of logic regions may also be useful. Additionally, other types of device regions may also be provided, for example, array regions for memory cells. The different devices may have different widths. For example, the gates of the devices may vary in width.

A gate stack 140 of a transistor is disposed in the device region. The gate stack includes a gate electrode layer 160 over a gate dielectric layer 120. In one embodiment, the layers of the gate stack forms a high-K metal gate.

In one embodiment, the gate dielectric layer may comprise a high-K dielectric material. Other types of gate dielectric materials may also be useful. The high-K dielectric material, for example, may be a Hf-based high-K dielectric material such as $HfO_2$, HfON, Hf—Si—$O_2$ or Hf—SiON, a Al-based high-K or a Zr-based high-K. Other types of high-K dielectric material may also be useful. The thickness of the dielectric layer may be, for example, about 20 Å. Other thicknesses may also be useful. In other embodiments, the dielectric layer may include a composite dielectric layer having multiple layers. For example, the composite dielectric layer may be SiON and HfO or SiON and HfSiO. Providing multiple layered high-K dielectric layers may be useful, for example, to increase the dielectric constant.

In one embodiment, the gate electrode layer 150 comprises a composite gate electrode layer having multiple gate electrode sub-layers. As shown, the gate electrode layer comprises first and second gate electrode layers 160 and 170. The second gate electrode layer is disposed over the first gate electrode layer. Providing a gate electrode layer having other number of layers may also be useful. In one embodiment, the first gate electrode layer comprises a metal gate electrode layer below a top gate electrode layer 170. The metal gate electrode is disposed over the gate dielectric layer. The metal gate electrode, in one embodiment, is disposed directly on top of the gate dielectric layer. In one embodiment, the metal gate layer comprises TiN. Other types of metal gate electrode materials may also be useful. For example, the metal gate electrode may be TaN, TiAlN, TaN/TiN, TaC, TaCN or a combination thereof, including TiN.

In one embodiment, the first gate electrode comprises edge portions having a thickness $T_E$ and a central portion having a thickness $T_C$. The edge portions extend from the edges of the active region along the width of the channel toward the central portion of the gate electrode. In one embodiment, the edge portion is about 30% of the overall width of the gate electrode. For example, in the case of a gate electrode with a width of about 80 nm, the edge portion is about 24 nm. Providing other widths for the edge portions may also be useful.

The first gate electrode comprises a graded or variable thickness. For example, $T_E$ and $T_C$ are different. The thickness differential between the edge portions and the central portion should be sufficient to reduce Vt roll up. In one embodiment, $T_E$ at the edge portions is less then $T_C$ at the central portion. The thickness $T_C$ may be the desired thickness of the first gate electrode while $T_E$ is less than the desired thickness. For example, $T_C$ may be from about 30-80 nm. In one embodiment, the thickness of $T_E$ may be about 60%-70% less than $T_C$. For example, $T_C$ may be about 80 nm while $T_E$ may be about 24-32 nm. Providing other thicknesses for $T_E$ and $T_C$ may also be useful.

The edge portions and central portion may be distinct, forming a gate electrode with the step. In other embodiments, the edge portions and central portion may be gradual. For example, the thickness $T_C$ from the interface of the edge and central portions may gradually decrease to the thickness $T_E$.

The first gate electrode may have the same thickness throughout along length of the channel.

The top gate electrode layer is disposed over the metal gate electrode. In one embodiment, the top gate electrode layer is disposed directly on top of the metal gate electrode. The top gate electrode layer, in one embodiment, includes a non-metal gate electrode. The top gate electrode layer has a polycrystalline (poly) structure. The top gate electrode layer, in one embodiment, comprises a polysilicon. Other types of top gate electrode materials may also be useful. For example, the top gate electrode layer comprises a silicon alloy, such as SiGe. The top gate electrode layer, for example, is thicker than the metal gate electrode. Other thicknesses for the top gate electrode may also be useful. For example, the top gate electrode may be about 300-800 Å thick. In one embodiment, the top gate electrode may be about 600 Å thick.

The device may include additional elements which are not shown. For example, the device may include heavily doped source/drain regions adjacent to the gate. The source/drain regions are doped with first polarity type dopants for a first type transistor. Dielectric gate sidewall spacers may be provided on the sidewalls of the gate. The gate sidewall spacers may be used to facilitate forming or defining lightly doped source/drain extension regions of the first polarity type. Metal silicide contacts may be disposed on the source/drain regions and top of the gate stack. Additionally, one or more interlevel dielectric layers in which interconnects are formed may also be provided.

FIG. 1b shows a cross-sectional view of another embodiment of a portion of a device. The device shown includes similar or common elements as that described in FIG. 1a. Common elements will not be described. As shown, the isolation region or dielectric region 180 has a top surface above the substrate, producing raised isolation regions. Providing raised isolation regions facilitates in forming a first gate electrode having a thickness $T_E$ at the edge portions which is different than a thickness $T_C$ at the central portion. In one embodiment, $T_E$ is less or thinner than $T_C$.

In one embodiment, the raised isolation region facilitates forming the first gate electrode in which $T_E$ is thinner than $T_C$. The amount which the surface of the STI regions is raised above the substrate surface should be sufficient to produce a variable metal gate electrode having a thickness $T_E$ which is thinner at the edge portions than the thickness $T_C$ at the central portion. In one embodiment, portions of the metal gate electrode proximate the raised isolation regions are thinner than portions distal from the raised isolation regions. In one embodiment, the surface of the STI region is raised about 40-50 Å above the substrate surface. Providing a STI region raised to other heights may also be useful. For example, the STI may be raised above the substrate about 40-230 Å or 40-370 Å. The higher that the STI is above the substrate, the greater the thinning of the first gate electrode at the edge portions. The height of the STI above the substrate should be selected to achieve the desired $T_E$ based on $T_C$.

Figure 2B:
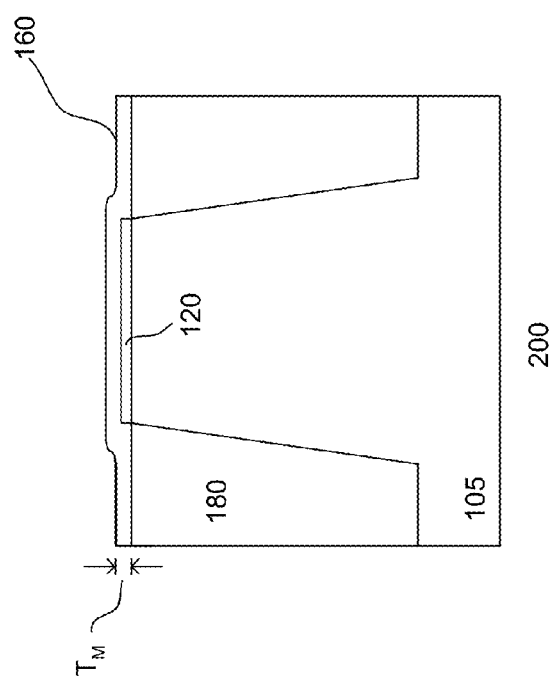

FIGS. 2a-e show cross-sectional views of an embodiment of a process 200 for forming a device or IC. Referring to FIG. 2a, a substrate 105 is provided. The substrate can comprise a silicon substrate, such as a lightly doped p-type substrate. Other types of substrates, including silicon germanium or silicon-on-insulator (SOI), are also useful.

As shown in FIG. 2a, a device region 110 is defined on the substrate. Although one device region is shown, it is however understood that the substrate may include various types of regions (not shown). For example, the substrate may include other device regions for other types of devices. The IC may include logic regions in which logic devices are formed.

Depending on the type of IC formed, the logic regions, for example, may include regions for different voltage devices. For example, the logic regions may include regions for high voltage (HV) devices, medium or intermediate voltage (IV) devices and low voltage (LV) devices. Other configurations of logic regions may also be useful. Additionally, other types of device regions may also be provided.

The device region is separated from other regions by an isolation region 180. The isolation region surrounds the device region. The isolation region comprises, for example, an STI region. Forming other types of isolation regions, such as LOCOS, may also be useful. Various processes can be employed to form the STI region. For example, the substrate can be patterned using mask and etch techniques to form a trench corresponding to the STI region. The mask or reticle, for example, may be referred to as the RX mask. After the trench is formed, it is filled with a dielectric material, such as silicon oxide. Chemical mechanical polishing (CMP) can be performed to remove excess dielectric material to provide a planar top surface. Other processes or materials can also be used to form the STI. Other types of isolation regions may also be employed. The depth of the STI may be, for example, about 300 nm. The STI may also have other depths.

A device well (not shown) may be formed in the device region. The device well, in one embodiment, comprises dopants which form a doped well. The depth of the doped well, for example, may be about 400-500 nm. Providing a doped well having other depths may also be useful. The doped well may be formed by implanting appropriate dopants with the desired dose and power into the substrate. The dopant type, dose and power may depend on the type of device to be formed. The doped well may comprise second polarity type dopants for a first polarity type device. For example, a p-type doped well may be for a n-type transistor. On the other hand, a n-type doped well may be for a p-type transistor.

To form the doped well, a well implant mask which exposes the device region is used. The implant mask, for example, comprises photoresist patterned by a lithographic mask. Since the device isolation region can serve as an implant mask, this allows for increased processing window for the patterning process to form the implant mask. The implant mask may be removed after the deep well is formed. Other techniques for forming the deep device well may also be useful. An anneal may be performed to diffuse the dopants, forming a doped well which extends to under the bottom of the STI.

Referring to FIG. 2b, a gate dielectric layer 120 is formed on the substrate. In one embodiment, the dielectric layer 120 may comprise a high-K dielectric layer. Other types of dielectric materials may also be used. Various types of high-K dielectric materials may be used. For example, the high-K dielectric layer may be Hf-based high-K such as $HfO_2$, HfON, Hf—Si—$O_2$ or Hf—SiON, Al-based high-K or Zr-based high-K. Other types of high k dielectric materials may also be used to form the gate dielectric layer. The dielectric layer may be about 10-25 Å thick. Forming the dielectric layer with other thicknesses may also be useful. The dielectric layer may be formed by, for example, CVD. The dielectric layer may also be formed using other deposition processes, such as thermal deposition processes.

In yet other embodiments, the dielectric layer may comprise a dielectric stack having a plurality of dielectric layers. In some embodiments, the dielectric layer may comprise a capping layer. Other configurations of the dielectric layer may also be useful.

As shown in FIG. 2b, a gate electrode layer 160 is formed. The gate electrode layer, for example, may be a first gate electrode layer of a composite gate electrode layer or stack having multiple gate electrode layers. In one embodiment, the first gate electrode layer comprises a metal gate electrode layer. The metal gate layer is formed, for example, over the dielectric layer. In one embodiment, the metal gate layer comprises TiN. Other types of metal gate electrode materials may also be useful. For example, the metal gate electrode may be TaN, TiAlN, TaN/TiN, TaC, TaCN or a combination thereof, including TiN.

The metal gate layer is formed having a thickness $T_M$. The thickness $T_M$ may be, for example, about 300-800 Å thick. In one embodiment, $T_M$ is about 800 Å. The thickness $T_M$ is the desired thickness of the metal gate layer. Forming the metal gate layer with other thicknesses may also be useful. The metal gate layer may be formed by, for example, PVD or sputtering process. The metal gate layer may also be formed using other deposition processes.

Figure 2C:
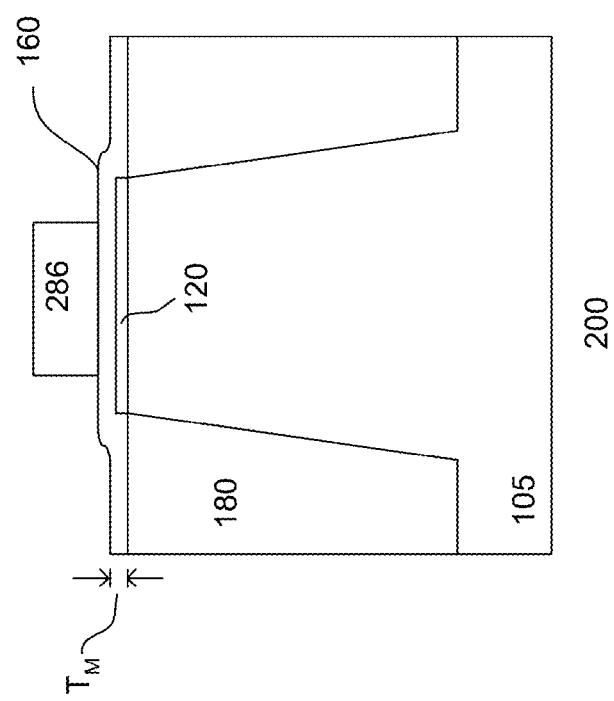

In FIG. 2c, a photoresist or soft mask layer 286 is formed on the first gate electrode layer. The photoresist layer is patterned by a lithographic mask or reticle. In one embodiment, the photoresist layer is patterned by the RX mask. In one embodiment, the photoresist mask is patterned by the RX mask which is printed smaller to expose the edge portions of the first gate electrode while protecting the central portion. For example, the RX mask is printed about 30% smaller. Printing the RX mask having other smaller sizes may also be useful. Various methods can be used to print a smaller mask. For example, printing smaller may be achieved by increasing the exposure dose to the photoresist while maintaining optimal focus. In other embodiments, another reticle which is smaller than the RX mask may be employed. To improve lithographic resolution, an anti-reflective coating (ARC) can be provided beneath the photoresist. Other techniques for patterning the photoresist may also be useful.

Figure 2D:
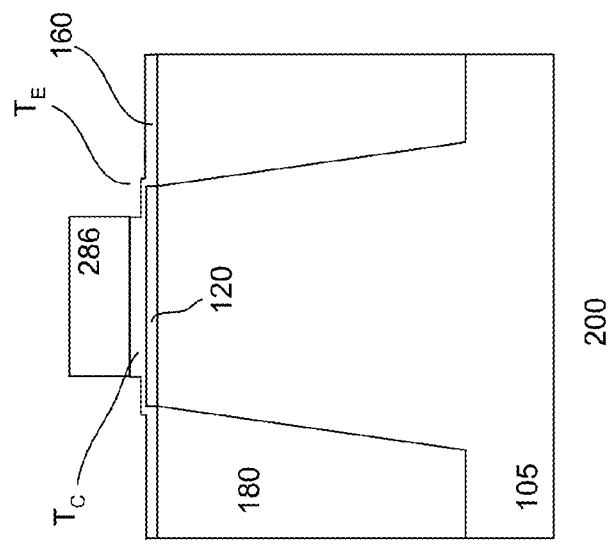

As shown in FIG. 2d, the first gate electrode is patterned using the soft mask. In one embodiment, the first gate electrode layer is partially etched using the soft mask. In one embodiment, the portions of the first gate electrode layer unprotected by the soft mask is thinned or partially removed. This reduces the thickness of the first gate electrode layer at the edge portions of the active region to $T_E$ while the mask protects the central portion of the active region. As such, the first gate electrode layer at central portion of the active region has a thickness $T_C$, which is equal to about $T_M$. The thickness $T_E$ may be about 60%-70% less than $T_C$. For example, $T_C$ may be about 80 nm while $T_E$ may be about 24-32 nm. Providing other thicknesses for $T_E$ and $T_C$ may also be useful.

In one embodiment, exposed portions of the first gate electrode layer may be patterned by a wet etch chemistry. The wet etch chemistry, in one embodiment, comprises a SC1 solution. The SC1 solution, for example, may include $NH_4OH$, $H_2O_2$, and water. Patterning the first gate electrode layer with SC1 may be performed at a temperature of about 25-40° C. Other etching techniques for patterning the first gate electrode layer, such as RIE, may also be useful.

Figure 2E:
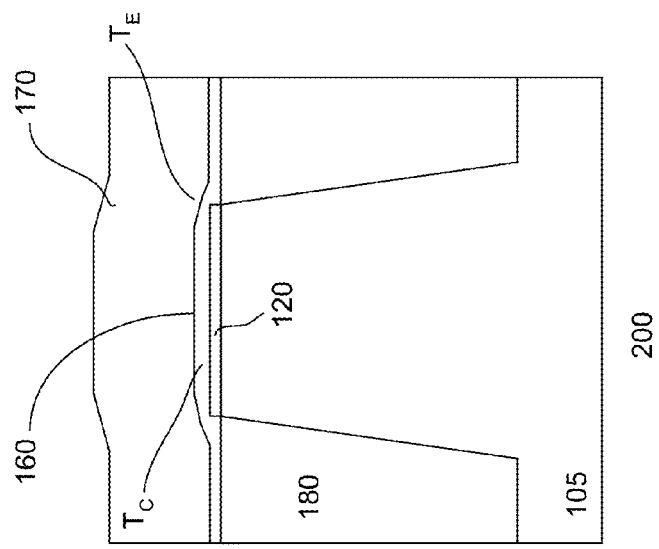

Referring to FIG. 2e, the soft mask is removed. The soft mask may be removed by, for example, a solvent clean. Other techniques for removing the photoresist mask may also be useful. The substrate may be cleaned after removing the soft mask.

In one embodiment, a top gate electrode layer 170 is formed on the substrate. The top electrode layer is formed, for example, over the first electrode layer. In one embodiment, the top electrode layer is formed directly over the first electrode layer. The top gate electrode layer, in one embodiment, includes a non-metal gate electrode material. The top gate electrode layer, for example comprises a polycrystalline material. The top gate electrode layer, in one embodiment, comprises polysilicon. Other types of top gate electrode materials may also be useful. For example, the top gate electrode layer comprises a silicon alloy, such as SiGe. In one embodiment, the top electrode layer may be amorphous silicon which is subsequently annealed to form polysilicon. The top gate electrode layer, in one embodiment, comprises a thickness which is greater than the first gate electrode layer. Other thicknesses for the top gate electrode may also be useful. For example, the top gate electrode may be about 300-800 Å thick. In one embodiment, the top gate electrode layer is about 500 Å. The top electrode layer may be formed, for example, by CVD. The top electrode layer may also be formed using other deposition processes.

The process continues to form the device. For example, further processing can include patterning the gate layers to form a gate stack, forming sidewall spacers on gate sidewalls, source/drain regions adjacent to the gate and metal silicide contacts may be formed on the various contact regions and the surface of the gate electrode. The processing may further include forming a PMD layer and contacts to the terminals of the cell as well as one or more interconnect levels, final passivation, dicing, assembly and packaging. Other processes may also be included. For example, other components, such as low voltage, medium voltage, and high voltage I/O devices can be formed prior to forming the interconnections.

Figure 3A:
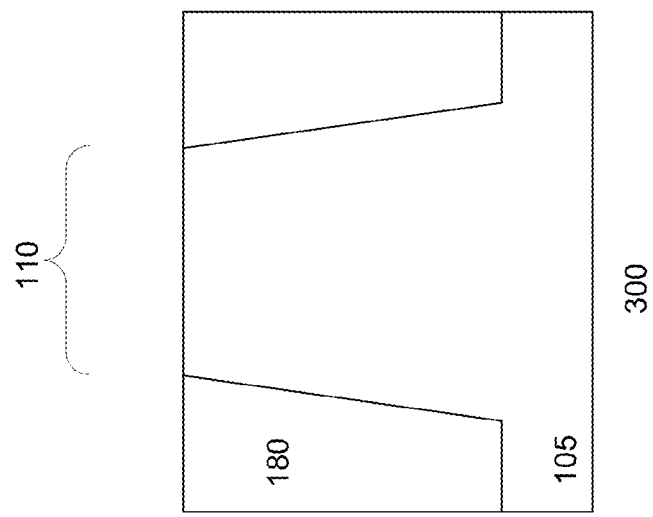

FIGS. 3a-d show cross-sectional views of another embodiment of a process 300 for forming a device or IC. Referring to FIG. 3a, a substrate 105 is provided. The substrate is at the stage of processing as described in FIG. 2a. For example, the substrate is prepared with an STI or isolation region 180 surrounding a device region 110. A device well (not shown) may be formed in the device region 110.

Figure 3B:
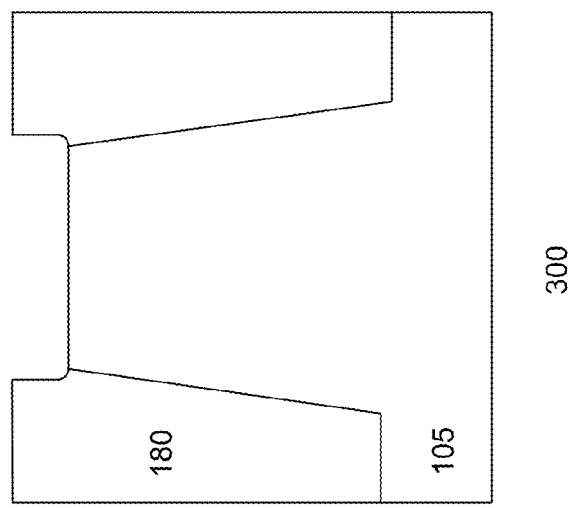

Referring to FIG. 3b, the substrate is processed to form a raised isolation region. For example, the raised isolation region includes a top surface which is above the top surface of the device region. The process may comprise a deglazing process. The deglazing process, for example, comprises a HF wet etch process. For example, after the mask used to pattern the trench is removed, this leaves the isolation region above the surface of the substrate. The deglazing process is employed to reduce the height of the isolation region. The deglazing process is employed to partially reduce the height of the isolation region, leaving a desired height remaining above the top surface of the substrate or device region. The height of the isolation region above the device region, for example, may be about 40-50 Å. Providing isolation regions which have other heights above the device region may also be useful. For example, the isolation region may be about 40-230 Å or 40-370 Å above the substrate surface. The maximum height of the STI, for example, may be the thickness of the mask. In such case, no deglazing process is performed. Other types of processes may also be employed to form raised isolation regions.

Figure 3C:
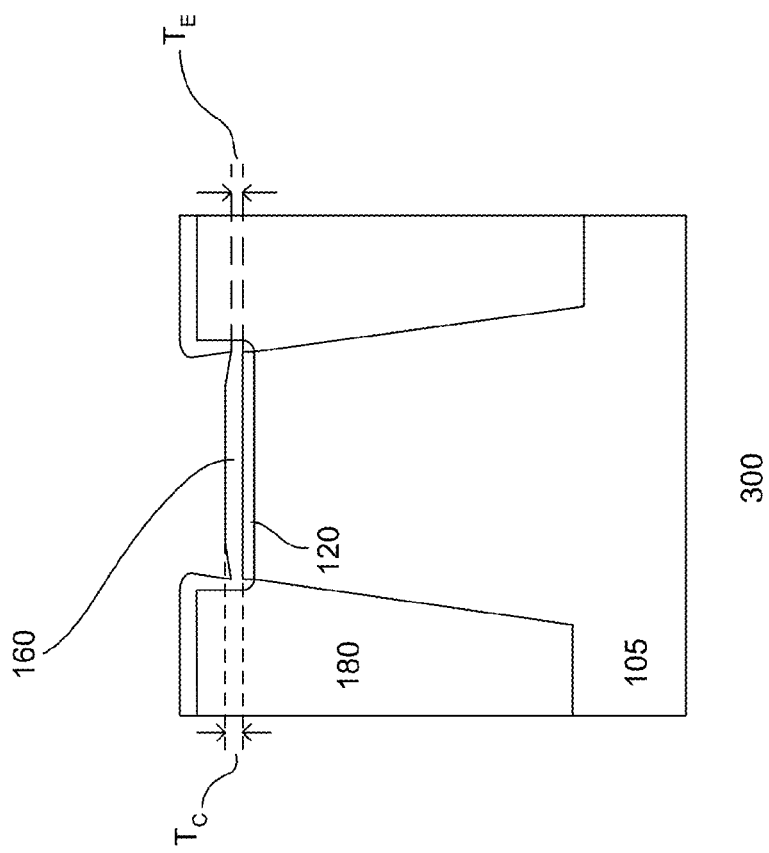

As shown in FIG. 3c, a gate dielectric layer 120 is formed on the substrate. In one embodiment, the dielectric layer may comprise a high-K dielectric layer. Various types of high-K dielectric materials may be used. For example, the high-K dielectric layer may be Hf-based high-K such as $HfO_2$, HfON, Hf—Si—$O_2$ or Hf—SiON, Al-based high-K or Zr-based high-K. In one embodiment, the high-K dielectric material comprises SiON and HfO. In another embodiment, the high-K dielectric material comprises SiON and HfSiO. Other types of high-K materials or non-high-K materials may also be used to form the dielectric layer. Various techniques may be employed to form the high-K dielectric layer. For example, selective or non-selective formation techniques may be employed. In one embodiment, the non-selective formation technique is used, in which the dielectric layer is subsequently patterned and portions removed during poly line formation. In other embodiments, the dielectric layer may comprise a plurality of dielectric layers to form a dielectric stack.

The thickness of the dielectric layer is, for example, about 10-25 Å. Other thicknesses for the dielectric layer may also be useful.

In yet other embodiments, the dielectric layer may include a capping layer. Various types of dielectric materials may be used to form the capping layer. For example, the capping layer may be, a high-K material (i.e. $Al_2$—$O_3$, $La_2O_3$ or etc), $SiO_2$ or SiON. Other types of capping materials may also be used to form the capping layer. The cap layer may be employed to provide the desired gate workfunction.

A gate electrode layer 160 is formed on the substrate. The gate electrode layer is formed, for example, over the gate dielectric layer 120. In one embodiment, the gate electrode layer comprises a metal gate electrode layer. The gate electrode layer, for example, may be a gate electrode layer of a gate electrode stack. The gate electrode layer, in one embodiment, is a first gate electrode layer of a gate electrode stack. In one embodiment, the first gate electrode layer comprises TiN. Other types of metal gate electrode materials may also be useful. For example, the metal gate electrode may be TaN, TiAlN, TaN/TiN, TaC, TaCN or a combination thereof, including TiN. The metal gate layer, in one embodiment, is formed by, for example, PVD or sputtering process.

In one embodiment, the first gate electrode layer is formed with a graded thickness. The first gate electrode comprises edge portions having a thickness $T_E$ and a central portion having a thickness $T_C$. The edge portions extend from the edges of the active region along the width of the channel toward the central portion of the gate electrode. The width of an edge portion may be about 30% of the overall width of the gate electrode. For example, the edge portion may be about 240 Å wide for a gate electrode width of 800 Å. Other widths for the edge portions may also be useful. The thicknesses $T_E$ and $T_C$ are different. In one embodiment, $T_E$ at the edge portions is less than $T_C$ at the central portion. The thickness $T_C$, for example, may be about 300-800 Å while $T_E$ may be about 60-70% less. Providing other thicknesses for $T_E$ and $T_C$ may also be useful.

The raised isolation region creates a shadowing effect for the PVD deposition process which thins the first gate electrode layer in the edge portions. The greater the height of or step formed by the isolation region, the more the thinning effect. The height or the raised isolation region should be selected to produce the desired $T_E$ and width of the edge portions.

Figure 3D:
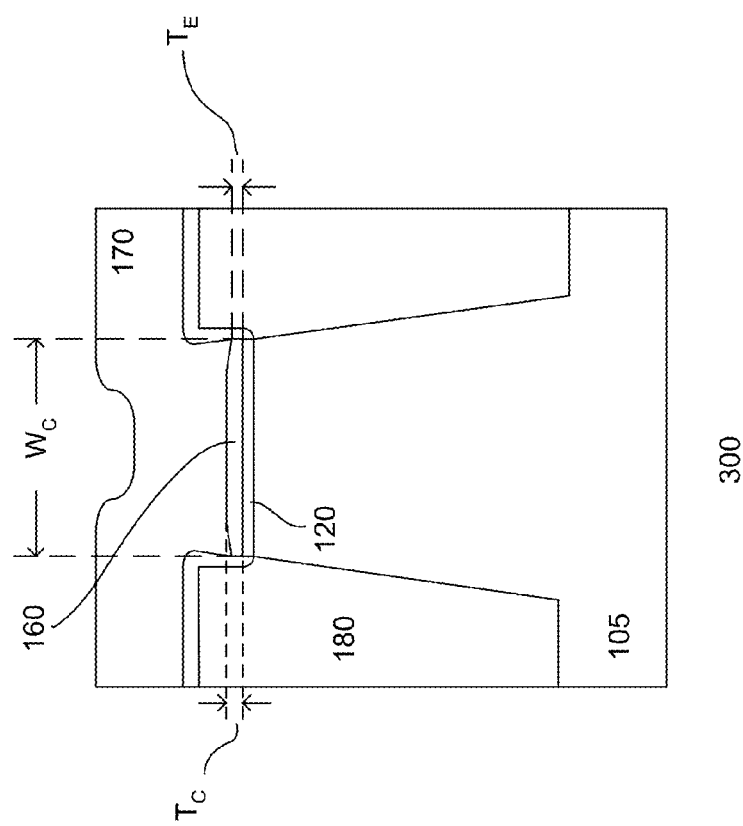

Referring to FIG. 3d, a layer of top electrode layer 170 is formed over the first electrode layer. The top electrode layer is formed, for example, over the metal gate layer. In one embodiment, the top electrode layer is formed directly over the first electrode layer. The top gate electrode layer, in one embodiment, includes a non-metal gate electrode. The top gate electrode layer comprises a polycrystalline. The top gate electrode layer, in one embodiment, comprises a polysilicon. Other types of top gate electrode materials may also be useful. For example, the top gate electrode layer comprises a silicon alloy, such as SiGe. The top electrode layer may also be an amorphous layer which is subsequently recrystallized. The thickness of the top gate electrode layer, for example, is about 300-800 Å. In one embodiment, the thickness of the top gate electrode layer, for example, is about 600 Å. Forming the top electrode layer with other thicknesses may also be useful. The top electrode layer may be formed by, for example, a CVD or a sputtering process. The top electrode layer may also be formed using other deposition processes.

The process continues to form the device. For example, further processing can include patterning the gate layers to form a gate stack, forming sidewall spacers on gate sidewalls, source/drain regions adjacent to the gate and metal silicide contacts may be formed on the various contact regions and the surface of the gate electrode. The processing may further include forming a PMD layer and contacts to the terminals of the cell as well as one or more interconnect levels, final passivation, dicing, assembly and packaging. Other processes may also be included. For example, other components, such as low voltage, medium voltage, and high voltage I/O devices can be formed prior to forming the interconnections.

FIG. 4 shows a SEM of an embodiment of a portion of a device 400. As shown, a device region is provided in a substrate 105. The device region is surrounded by an isolation region 180. As shown, a top surface of the isolation region is disposed above a top surface of the device region. A metal gate layer is disposed on a surface of the substrate, covering the isolation and device regions. The metal gate layer includes edge portions 164 having a thickness $T_E$ which is less than a thickness $T_C$ at the central portion 162. The difference in $T_E$ and $T_C$ is facilitated by the raised isolation region surrounding the device region. A top gate electrode layer 170 is disposed over the metal gate layer.

We have discovered that providing a metal gate electrode layer having a variable thickness reduces $V_T$ roll up. For example, a metal gate electrode layer in which the edge portions are thinner than the central portion along the width of the channel reduces $V_T$ roll up.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor device comprising:
providing a substrate having a substrate surface, the substrate is prepared with a device region surrounded by an isolation region, the device region serves as a device region of a transistor having a width direction and a length direction, wherein the width direction is a channel width direction of the transistor and the length direction is a channel length direction of the transistor, wherein a length of the channel is between source/drain regions of the transistor, the width and length directions are perpendicular, and the device region includes edge portions along the width direction of the device region and a central portion between the edge portions; and
forming a metal gate electrode layer over the surface of the substrate in the device region, the metal gate electrode having a top surface, wherein the metal gate electrode layer comprises a graded thickness along the width direction of the device region, the graded thickness resulting in the top surface of the metal gate electrode having an uneven height with respect to the substrate surface, wherein a thickness $T_E$ at edge portions of the device region along the width direction with respect to the substrate surface is thinner than a thickness $T_C$ at the central portion of the device region.

2. The method of claim 1 wherein forming the metal gate electrode with the graded thickness comprises:
protecting the central portion of the metal gate electrode with a mask which leaves edge portions of the metal gate electrode exposed; and
thinning edge portions of the metal gate electrode to the thickness $T_E$.

3. The method of claim 2 wherein the mask is formed by printing the mask smaller to expose the edge portions of the metal gate electrode.

4. The method of claim 1 wherein forming the metal gate electrode with the graded thickness comprises:
providing the isolation region with a top surface above the top surface of the substrate to form a raised isolation region; and
depositing the metal gate electrode layer over the raised isolation region and the substrate, wherein the raised isolation region creates a shadowing effect which thins the edge portions of the metal gate electrode to produce the thickness $T_E$.

5. The method of claim 4 wherein the metal gate electrode layer is formed by PVD.

6. The method of claim 4 wherein the top surface of the isolation region is sufficiently above the top surface of the substrate to form the metal gate electrode layer with the graded thickness.

7. The method of claim 4 wherein the top surface of the isolation region is about 40-50 Å higher than the top surface of the substrate.

8. The method of claim 1 wherein $T_E$ is equal to about 30-40% of $T_C$.

9. The method of claim 1 wherein $T_E$ is sufficiently less than $T_C$ to reduce VT roll up.

10. The method of claim 1 wherein an edge portion is about 30% of an overall width of the device region.

11. The method of claim 1 wherein the graded thickness is a gradual change in thickness from $T_C$ to $T_E$.

12. The method of claim 1 comprises forming a gate dielectric layer, wherein the gate dielectric layer is in between the metal gate electrode layer and the substrate.

13. The method of claim 12 wherein:
the edge portions are proximate to the isolation region;
the central portion is distal the isolation region; and
the thickness $T_E$ of the metal gate electrode layer at the edge portions with respect to the substrate surface which contacts the gate dielectric layer is thinner than the thickness $T_C$ of the metal gate electrode layer at the central portion which contacts the gate dielectric layer along the width direction of the device region.

14. The method of claim 1 which further comprises forming a polycrystalline gate electrode layer directly over the metal gate electrode layer.

15. A device comprising:
a substrate with a device region surrounded by an isolation region, the device region serves as a device region of a transistor having a width direction and a length direction, wherein the width direction is a channel width direction of the transistor and the length direction is a channel length direction of the transistor, wherein a length of the channel is between source/drain regions of the transistor, the width and length directions are perpendicular, and the device region includes edge portions along the width of the device region and a central portion between the edge portions;
a metal gate electrode layer disposed over surface of the substrate over the device region, the metal gate electrode layer includes a graded thickness along the width direction of the device region in which a top surface of the metal gate electrode includes an uneven height with respect to the substrate surface, wherein the metal gate layer at the edge portions along the width direction of the device region has a thickness $T_E$ that is thinner than a thickness $T_C$ at the central portion of the device region.

16. The device of claim 15 wherein the isolated region comprises a raised isolation region, the raised isolation region has a top surface above a top surface of the substrate.

17. The device of claim 15 wherein $T_E$ is equal to about 30-40% of $T_C$.

18. The device of claim 15 wherein $T_E$ is sufficiently less than $T_C$ to reduce VT roll up.

19. The device of claim 15 wherein an edge portion is about 30% of an overall width of the device region.

20. The device of claim 15 wherein the graded thickness is a gradual change in thickness from $T_C$ to $T_E$.

21. The device of claim 15 comprises a gate dielectric layer in between the metal gate electrode layer and the substrate.

22. The device of claim 21 wherein the gate dielectric layer comprises a high-K dielectric layer.

23. The device of claim 15 which further comprises a polycrystalline gate electrode layer directly over the metal gate electrode layer.

24. The device of claim 15 wherein:
the edge portions are proximate to the isolation region;
the central portion is distal the isolation region; and
the thickness $T_E$ of the metal gate electrode layer at the edge portions with respect to the substrate surface which contacts the gate dielectric layer is thinner than the thickness $T_C$ of the metal gate electrode layer at the central portion which contacts the gate dielectric layer along the width direction of the device region.

25. A device comprising:
a substrate having a substrate surface;
a device region in the substrate, wherein the device region serves as a device region of a transistor having a width direction and a length direction, wherein the width direction is a channel width direction of the transistor and the length direction is a channel length direction of the transistor, wherein a length of the channel is between source/drain regions of the transistor, the width and length directions are perpendicular;
an isolation region surrounding the device region, wherein the device region along the width direction comprises
an edge portion proximate the isolation region, and
a central portion distal the isolation region;
a gate dielectric layer over the device region and in contact with the substrate; and
a metal gate electrode layer over and in contact with the gate dielectric layer, wherein the metal gate electrode includes a top gate electrode surface which is uneven in height along the width direction of the device region with respect to the substrate surface, a thickness $T_E$ of the metal gate electrode layer at the edge portion with respect to the substrate surface along the width direction of the device region is thinner than a thickness $T_C$ of the metal gate electrode layer at the central portion.

26. The device of claim 25 which further comprises a polycrystalline gate electrode layer directly over the metal gate electrode layer.

* * * * *